United States Patent [19]

Elliott

[11] Patent Number: 5,075,255
[45] Date of Patent: Dec. 24, 1991

[54] METHOD OF REMOVING CONTAMINANTS FROM A PLATED ARTICLE WITH A CLEAN BURNING HYDROGEN FLAME

[75] Inventor: Alexander J. Elliott, Mesa, Ariz.

[73] Assignee: Motorola, Inc., Schaumburg, Ill.

[21] Appl. No.: 661,143

[22] Filed: Feb. 27, 1991

[51] Int. Cl.$^5$ .................. H01L 21/44; H01L 21/60; H05K 3/26; B05D 3/08
[52] U.S. Cl. .................. 437/210; 437/220; 437/247; 437/245; 427/224; 427/383.1
[58] Field of Search .............. 437/210, 220, 247, 245; 427/224, 383.1

[56] References Cited

FOREIGN PATENT DOCUMENTS 60-153133  8/1985  Japan .
1-181551   7/1989  Japan .................. 437/210

Primary Examiner—Robert Kunemund
Assistant Examiner—David E. Graybill
Attorney, Agent, or Firm—Joe E. Barbee

[57] ABSTRACT

A clean burning high temperature flame is used to vaporize contaminants from a lead frame's surface, and also vaporize contaminants up to a shallow depth into the lead frame.

13 Claims, 1 Drawing Sheet

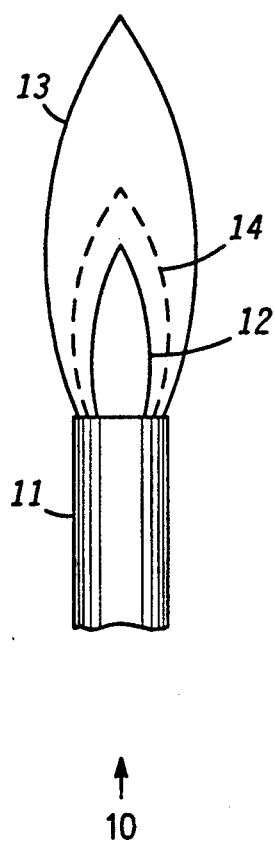

ND OF THE INVENTION

The present invention relates, in general, to lead frames for semiconductor device packages, and more particularly, to a novel method of removing contaminants from a lead frame.

In the past, lead frames that were used to produce semiconductor device packages had contaminants that made it difficult to produce reliable semiconductor device packages. Typically, lead frames were plated with a material, such as nickel, to protect the lead frame from corrosion. This plating oxidized to nickle oxide which improved adhesion of encapsulation material to the lead frame, and also improved adhesion of wire bonds and die bonds to the lead frame. During plating operations, the lead frames were immersed in plating baths or solutions. As these solutions were repeatedly used, they gradually became contaminated with phosphorus, chlorine, and other chemicals. These chemicals were applied to the lead frame along with the plating material and formed contaminants that were dispersed throughout the plated material. Since contaminants in the plating solution varied over time, contaminant concentrations in the lead frame's plating material also varied making it difficult to develop standard die bonding, wire bonding, and encapsulation procedures that consistently produced reliable results.

In addition to plating contaminants, hydrocarbons and other contaminants developed on the lead frame's surface. These contaminants resulted from a variety of sources including body oils from humans handling the lead frames, machine oils from machines handling the lead frames, and from other contaminants in the environment.

Previous methods for cleaning lead frames reduced some of the contaminants' concentration, but, handling of the lead frames during assembly operations could reintroduce some contaminants. Additionally, the previous cleaning methods generally left chemical residues, such as phosphorus, on the lead frames which added to the contaminants. Due to the variation of contaminants in the plating baths, residues from cleaning operations, and the variety of handling operations, the amount of contamination varied between lead frames from one production run to the next. Such variations made it difficult to establish packaging assembly procedures that could accommodate the lead frame's varying contaminant concentrations.

Accordingly, it is desirable to have a method of removing contaminants from lead frames which elimiinates contaminants from lead frame surfaces, which eliminates contaminants from plating material on the lead frames, and which provides a consistently low level of contaminants thereby permitting consistent and repeatable assembly procedures to be established.

SUMMARY OF THE INVENTION

Briefly stated, the present invention is achieved by creating a clean burning high temperature flame that vaporizes contaminants from a lead frame's surface, and also vaporizes contaminants up to a shallow depth into the lead frame.

BRIEF DESCRIPTION OF THE DRAWINGS

The sole FIGURE is an illustration of the different zones of a flame which is useful in understanding the present invention.

DETAILED DESCRIPTION OF THE DRAWINGS

During the assembly of a semiconductor device package, lead frame contaminants, especially phosphorus, reduce the adherence of plastic molding compounds to the lead frame, and cause voids in the die bonding material. Reduced adherence often results in small voids between the mold compound and the lead frame thereby permitting moisture to enter the package. Moisture corrodes wire bonds, corrodes metal on the surface of semiconductor die, and often results in failure of semiconductor devices. In extreme cases, voids around a package's leads permit the leads to vibrate resulting in metal fatigue of the wires and also of wire bonds attached to the leads. Lead frame contaminants also can cause voids in the material used to attach semiconductor die to a lead frame. Die bond voids can cause die to crack or separate from a lead frame, and also reduces a package's thermal conductivity. Contaminants have a different effect on wire bonds. The reliability of wire bonds attached to a lead frame is primarily degraded by hydrocarbon and chemical contaminants on the lead frame's surface while wire bond reliability is enhanced by the presence of phosphorus in the lead frame. A typical lead frame is disclosed in U.S. Pat. No. 3,793,474 which issued to Dunn et al on Feb. 19, 1974 and is hereby incorporated herein by reference.

Consequently, surface concentrations of phosphorus reduce encapsulation material adherence to a lead frame and produce die bond voids, but enhance the adherence of wire bonds to the lead frame. Therefore, removal of contaminants from a lead frame should remove surface contaminants, including phosphorus, yet maintain a sufficient phosphorus content in the lead frame to permit good adhesion of wire bonds.

The present invention includes utilizing a clean burning high temperature flame to remove contamination from a plated lead frame. While the invention is described with specific preferred embodiments, it is evident that many alternatives and variations will be apparent to those skilled in the art. More specifically the invention has been described for a particular hydrogen flame that removes contaminants from a nickel plated lead frame, although the method is directly applicable to other platings, as well as lead frames that are not plated and to flames produced with other clean burning fuels.

In order to remove contamination from an article, the removal procedure itself should not introduce contaminants. In most instances, a flame produces hydrocarbons that could contaminate an article exposed to the flame. One clean burning fuel that generally does not produce contaminants when burned is pure hydrogen. In some cases, hydrogen can be contaminated by absorbing contaminants from its surroundings, therefore pure hydrogen should be used to produce a clean flame. Another possible source of contamination when burning pure hydrogen is the oxygen source that sustains the burning. If the oxygen source has absorbed hydrocarbons or other contaminants from the environment, it would introduce contaminants into the hydrogen flame. Therefore, to produce a clean burning hydrogen flame, it is necessary to provide an uncontaminated source of oxygen and hydrogen. One method to produce a clean burning hydrogen flame is to decompose water into pure hydrogen and pure oxygen by electrolysis, then burn the pure hydrogen in the presence of the pure oxygen, in a basic mixture of two parts hydrogen to one part oxygen, before either absorbs contaminants from the environment. Typically, the two gasses are mixed in the appropriate proportions then the gas mixture is burned.

Referring to the sole Figure, a hydrogen flame 10 includes an inner cone 12, an outer cone 13, and a reduction zone approximately between dotted line 14 and inner cone 12. Inner cone 12 is practically invisible and is the area where the majority of hydrogen is burned. Pure hydrogen and pure oxygen are supplied to a torch 11 that mixes the two gasses so they can combine in inner cone 12. Just past inner cone 12 is the flame's reduction zone which is its hottest area producing temperatures of approximately 3200 degrees centigrade. Past the reduction zone is outer cone 13 where environmental oxygen mixes with the flame. Generally, inner cone 12 and the reduction zone are free of contaminants, while environmental contaminants may be introduced into outer cone 13. The extremely hot and clean reduction zone can be used to vaporize contaminants.

The temperature of hydrogen flame 10 can be reduced if a combustible material such as alcohol, acetone, etc. is added by bubbling the hydrogen and oxygen gas mixture through the combustible material. For example, the temperature of a hydrogen flame produced from burning hydrogen containing methanol produces a flame temperature of approximately 2600 degrees centigrade compared to 3200 degrees centigrade for a pure hydrogen flame. Burning the added combustible material requires additional oxygen, beyond that required to burn the hydrogen, thereby increasing a flame's reducing zone. The additional oxygen is supplied from the environment.

It has been found that exposing a nickel plated lead frame to the reduction zone of hydrogen flame 10 for a brief period of time can vaporize contaminants from the lead frame. The brief exposure to hydrogen flame 10 not only removes contaminants on a lead frame's surface, but also vaporizes phosphorus and other contaminants that are at shallow subsurface depths into the lead frame's plating. Since a hydrogen flame has such a high temperature, it is important to ensure the exposure is sufficiently brief to prevent heating the lead frame. In the preferred embodiment, a nickel plated lead frame is exposed to a clean burning hydrogen flame for approximately 200 milliseconds to remove contaminants at depths of up to 17 angstroms into the nickel plating. The hydrogen flame removes contaminants and exposes a pure nickel surface that rapidly oxidizes to form nickel oxide thereby increasing adhesion between the lead frame and the encapsulating material. Additionally, the increased amount of exposed nickel also reduces die bond voids.

Vaporizing contaminants with a hydrogen flame also facilitates reliable wire bonds. Pressure used during wire bonding operations creates a depression in the lead frame thereby causing the wire bond to be formed approximately 40 angstroms below the plating material's surface. Since brief exposure to the hydrogen flame only removes contaminants, including phosphorous, to shallow subsurface depths, the surface contaminants that may effect wire bonding are removed but phosphorous remains in the plating material thereby improving the adhesion of wire bonds. Consequently this method of removing contaminants from a lead frame provides improved encapsulation material adhesion and reduced die bond voids without degrading the adhesion of wire bonds to the lead frame.

Incorporation of a clean hydrogen flame at the beginning point of a semiconductor package assembly operation provides a lead frame that has a consistently low level of contaminants. This consistent contaminant level facilitates developing consistent assembly procedures that provide high reliability packages.

By now it should be appreciated that there has been provided a novel way to remove contaminants from lead frames used for producing semiconductor device packages. Briefly vaporizing contaminants with a clean flame removes surface contaminants and shallow subsurface contaminants yet allows retention of sufficient phosphorus to provide reliable wire bonding to the lead frame. Use of a clean burning hydrogen flame to vaporize contaminants from lead frames immediately before the lead frame is used in a package assembly operation prevents reformation of surface contamination and provides a consistently low level of contamination that permits establishing repeatable assembly procedures and results in consistent package reliability.

I claim:

1. A method of removing contamination from a nickel plated lead frame that is used in producing a semiconductor device package which comprises:
   providing a nickel plated lead frame having contaminants;
   decomposing water into pure hydrogen and pure oxygen;
   burning the pure hydrogen in the presence of the pure oxygen to produce a clean flame having a high temperature;
   vaporizing contaminants from the nickel plated lead frame by briefly exposing at least a portion of the lead frame to a portion of the clean flame.

2. The method of claim 1 wherein providing a nickel plated lead frame having contaminants includes providing a nickel plated lead frame having a phosphorus contaminant in the nickel plating.

3. The method of claim 1 wherein providing a nickel plated lead frame having contaminants includes providing a nickel plated lead frame having a hydrocarbon contaminant on surfaces of the lead frame.

4. The method of claim 1 wherein vaporizing contaminants from the nickel plated lead frame includes vaporizing contaminants to a depth of approximately 17 angstroms into the lead frame.

5. The method of claim 1 wherein the vaporizing contaminants step includes briefly exposing at least a portion of the lead frame to a reduction zone of the clean flame.

6. The method of claim 1 wherein the vaporizing contaminants step includes exposing at least a portion of the lead frame to a portion of the clean flame for approximately 200 milliseconds.

7. The method of claim 1 wherein decomposing water includes decomposing water by electrolysis.

8. The method of claim 1 further including passing the pure hydrogen through a combustible material to reduce the high temperature of the clean flame.

9. The method of claim 1 further including passing the hydrogen through an alcohol to reduce the high temperature of the clean flame.

10. A method of removing contaminants from a plated article which comprises:

providing a plated article; decomposing water into pure hydrogen and pure oxygen;

producing a clean flame by burning the pure hydrogen in the presence of the pure oxygen;

vaporizing contaminants from the plated article by exposing the plated article to the clean flame.

11. The method of claim 10 wherein producing a clean flame includes burning a clean buring fuel to produce the clean flame.

12. The method of claim 10 wherein the vaporizing contaminants step includes exposing the plated article to a reduction zone produced by the clean flame.

13. The method of claim 10 wherein the vaporizing contaminants step includes exposing the plated article to the clean flame for a brief period of time.

* * * * *